United States Patent [19]

Taylor et al.

[11] Patent Number: 4,469,950
[45] Date of Patent: Sep. 4, 1984

[54] CHARGED PARTICLE BEAM EXPOSURE SYSTEM UTILIZING VARIABLE LINE SCAN

[75] Inventors: Norman J. Taylor, Wenham; Paul F. Petric, Swampscott, both of Mass.

[73] Assignee: Varian Associates, Inc., Palo Alto, Calif.

[21] Appl. No.: 354,822

[22] Filed: Mar. 4, 1982

[51] Int. Cl.³ .............................................. H01J 37/00
[52] U.S. Cl. .................................. 250/492.2; 250/398
[58] Field of Search .................. 250/492.2, 492.3, 398; 219/121 EB, 121 EM

[56] References Cited

U.S. PATENT DOCUMENTS

| | | | |
|---|---|---|---|
| 3,900,737 | 8/1975 | Collier et al. | 250/492 A |
| 4,112,305 | 9/1978 | Goto et al. | 250/492 R |
| 4,117,340 | 9/1978 | Goto et al. | 250/492 A |
| 4,145,597 | 3/1979 | Yasuda | 219/121 EB |
| 4,151,422 | 4/1979 | Goto et al. | 250/492 A |
| 4,167,676 | 9/1979 | Collier | 250/492 A |
| 4,182,958 | 1/1980 | Goto et al. | 250/492 A |
| 4,213,053 | 7/1980 | Pfeiffer | 250/492 A |
| 4,258,265 | 3/1981 | Sumi | 250/492 A |

OTHER PUBLICATIONS

H. Pfeiffer, "Variable Spot Shaping for Electron Beam Lithography," J. Vac. Sci. Technol., vol. 15, No. 3, May/Jun. 1978, p. 887.
W. Knauer, "Boersch Effect in Electron-Optical Instruments," J. Vac. Sci. Technol., vol. 16, No. 6, Nov./Dec. 1979, p. 1676.
E. Goto et al., "Design of Variable Shaped Beam Systems," Proc. of the 8th Int. Conf. on Electron and Ion Beam Science and Technology, 1978, p. 135.
T. Groves et al., "Electron-Beam Broadening Effects Caused by Discreteness of Space Charge," J. Vac. Sci. Technol., vol. 16, No. 6, Nov./Dec. 1979, p. 1680.
M. Thomson et al., "Double-Aperture Method of Producing Variably Shaped Writing Spots for Electron Lithography," J. Vac. Sci. Technol., vol. 15, No. 3, May/Jun. 1978, p. 891.
Goto et al., "Design of a Variable-Aperture Projection and Scanning System for Electron Beam," J. Vac. Sci. Technol., vol. 15, No. 3, May/Jun. 1978, p. 883.
E. Cogswell et al., "Electron Lithography System with Variable-Shaped Electron Beam," Proc. of the 8th Int. Conf. on Electron and Ion Beam Science and Technology, 1978, p. 117.
H. Pfeiffer et al., "Advanced Beam Shaping Techniques for Electron Lithography," Proc. of the 8th Int. Conf. on Electron and Ion Beam Science and Technology, 1978, p. 149.

*Primary Examiner*—Bruce C. Anderson
*Attorney, Agent, or Firm*—Stanley Z. Cole; William R. McClellan

[57] ABSTRACT

A charged particle beam exposure system for selectively irradiating the surface of a workpiece to be patterned. The beam has a cross-section at the surface of the workpiece comprising a projected line on variable length, of controlled width and one of two orthogonal orientations. An image of an L-shaped aperture is focussed on a shaping aperture with two adjacent orthogonal edges and is deflected relative to the shaping aperture to provide an intermediate line of desired length, width and orientation. The intermediate line is defined by the portion of the image of the L-shaped aperture which is superimposed on the shaping aperture. An image of the intermediate line is projected onto the workpiece to form the projected line which is scanned over the surface of the workpiece. Radial beam spreading is reduced and pattern line resolution is improved in the disclosed system.

10 Claims, 12 Drawing Figures

CHARGED PARTICLE BEAM EXPOSURE SYSTEM UTILIZING VARIABLE LINE SCAN

DESCRIPTION

Government Rights

The Government has rights in this invention pursuant to Contract No. F19628-80-C-0173 awarded by the Department of the Air Force.

BACKGROUND OF THE INVENTION

This invention relates to charged particle beam lithography and, more particularly, to an exposure system in which scanning is performed by a high resolution variable length line.

Electron beam exposure systems are used commercially for selectively irradiating a resist-coated workpiece to define the features of a semiconductor device. The workpiece can be a mask plate or can be a resist-coated semiconductor wafer in which features are defined directly. In either case, an electron beam is controlled in a highly accurate, high speed manner to expose microminiature patterns in the electron resist material.

Various approaches have been taken in controlling the electron beam. A small circular spot beam can be raster scanned over the entire surface of the workpiece and turned on or off to produce the desired pattern. A system using this approach is disclosed in U.S. Pat. No. 3,900,737, issued Aug. 19, 1975, to Collier et al. Alternatively, the spot beam can be directed to desired pattern areas and scanned only over those pattern areas in a vector scanning approach. Either approach is relatively slow since the area covered by the spot beam at any instant is extremely small. In another system, the electron beam is shaped into rectangles of variable shape and size. The rectangles are used to flash expose successive areas of the pattern. Such a system is described by H. Pfieffer in "Variable Spot Shaping for Electron-Beam Lithography," J. Vac. Sci. Technol., Vol. 15, No. 3, May/June 1978, p. 887. One drawback of variable shaped rectangle systems is the difficulty in exposing angled or odd-shaped pattern features.

In yet another approach, an elongated rectangular beam is scanned in a direction perpendicular to its long dimension. As the beam is scanned, the length of the rectangle is varied to define a desired pattern. This approach permits patterns of almost any shape to be exposed in a single operation. In producing a variable shaped beam, an image of a first square aperture is focused on a second square aperture. Shaping deflectors dynamically position the image of the first aperture relative to the second aperture so as to provide a beam cross-section of the desired length and width.

Electron beam exposure systems typically have the capability of exposing patterns with features of one micrometer or less. In such systems, even small inaccuracies in the size or position of the electron beam can seriously degrade system performance. One known source of electron beam inaccuracy is the coulomb repulsion between electrons in the beam. Repulsion between electrons along the axis of the beam causes a spread in electron energies and is known as the Boersch effect. See, for example, W. Knauer, "Boersch Effect in Electron-Optical Instruments," J. Vac. Sci. Technol., Vol. 16, No. 6, Nov./Dec. 1979, p. 1676. Repulsion between electrons transverse to the axis of the beam causes radial spreading of the beam. See, for example, E. Goto et al., "Design of Variable Shaped Beam Systems," Proc. of the 8th Int. Conf. on Electron and Ion Beam Science and Technology, 1978, p. 135, and T. Groves et al., "Electron-Beam Broadening Effects Caused by Discreteness of Space Charge," J. Vac. Sci. Technol., Vol. 16, No. 6, Nov./Dec. 1979, p. 1680. Either type of repulsion causes loss of resolution in the system. The radial spreading contributes directly to loss of resolution. Energy spreading results in loss of resolution since electrons with different energies undergo different deflections as they pass through lenses and deflectors.

It has been determined that energy spreading occurs principally at the electron beam crossover points. Radial spreading, however, occurs progressively along the length of the electron beam and is approximately proportional to the beam current and to the length over which the coulomb repulsion occurs. Therefore, in order to minimize radial beam spreading, it is desirable to minimize both the length of the electron optical column and the beam current.

Conflicting with these requirements is the necessity for irradiating the workpiece with the highest possible electron beam current in order to achieve high speed operation.

As noted hereinabove, prior art systems have utilized two square apertures for shaping the beam into a rectangle of variable length. The current between the two apertures is limited only by the first square aperture. Other prior art systems have employed three square shaping apertures to trim the beam to the desired size and shape and reduce the effect of radial beam spreading. A disadvantage of this approach is the added complexity in the electron optical column. In addition to the third aperture, an additional lens and deflector are required. A further disadvantage is the increase in column length necessitated by the additional elements.

Apertures of various shapes have been used in electron optical columns. Character-shaped apertures are used to project characters directly on a workpiece in U.S. Pat. No. 4,213,053, issued July 15, 1980 to Pfieffer. Apertures for a four-spot raster scanning system are shown by M. Thompson et al., in "Double-Aperture Method of Producing Variably Shaped Writing Spots for Electron Lithography," J. Vac. Sci. Technol., Vol. 15, No. 3, May/June 1978, p. 891. However, neither of these references is related to scanning with a line of variable length.

It is a general object of the present invention to provide a new and improved charged particle beam exposure system for selective irradiation of a workpiece.

It is another object of the present invention to provide a charged particle beam exposure system wherein pattern exposure is performed by scanning with a high resolution line of variable length and controlled width.

It is yet another object of the present invention to provide a charged particle beam exposure system wherein beam spreading is reduced.

SUMMARY OF THE INVENTION

According to the present invention, these and other objects and advantages are achieved in a novel charged particle beam exposure system for selectively irradiating the surface of a workpiece to be patterned. The system is of the type wherein the beam has a cross-section comprising a projected line of variable length, controlled width and one of two orthogonal orientations. The system comprises means for generating a charged particle beam and aperture plate means including aperture means positioned for illumination by the beam. The aperture plate means is operative to shape the beam so as to provide the beam with a cross-section comprising two generally orthogonal elongated figures. The system further includes a shaping aperture plate having a shaping aperture with two adjacent orthogonal edges, means for focusing an image of the elongated figures onto the shaping aperture plate and means for deflecting the image of the elongated figures relative to the orthogonal edges of the shaping aperture so as to provide an intermediate line of desired length, width and orientation. The intermediate line is defined at any instant of time by the portion of the image of the elongated figures which is superimposed on the shaping aperture. The system additionally includes means for projecting a demagnified image of the intermediate line onto the workpiece, thereby forming the projected line at the surface of the workpiece and means for directing the line to any specified position on the surface of the workpiece.

BRIEF DESCRIPTION OF THE DRAWINGS

For a better understanding of the present invention, together with other and further objects, and advantages and capabilities thereof, reference may be had to the accompanying drawings which are incorporated herein by reference and in which.

DETAILED DESCRIPTION OF THE INVENTION

Figure 1:
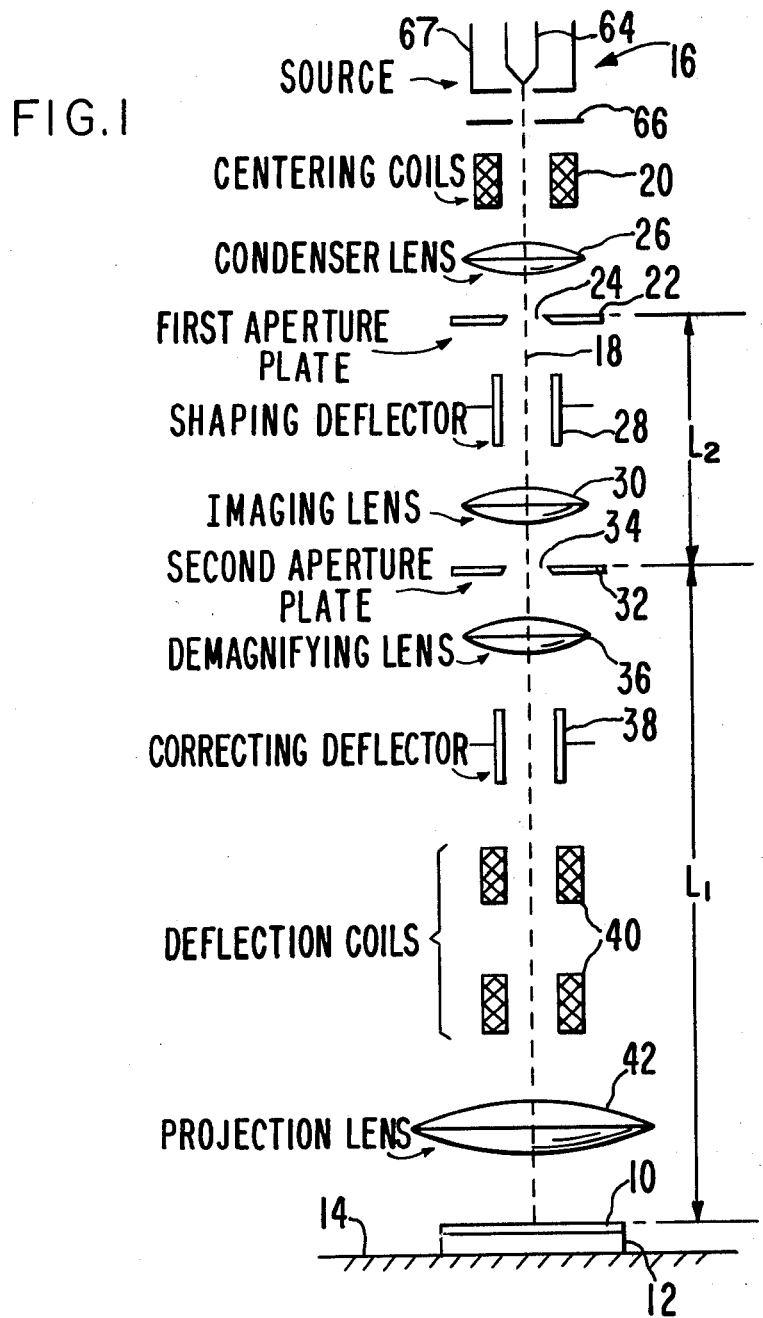
FIG. 1 is a schematic diagram of a charged particle beam system in accordance with the present invention.

A charged particle beam exposure system for selectively irradiating a workpiece comprising a resist layer 10 on a substrate 12 is shown in schematic form in FIG. 1. The substrate 12, which can be a mask plate or a semiconductor wafer, is mounted on a worktable 14, or stage, which is movable in the x and y directions perpendicular to the direction of the charged particle beam. In the present illustrative example, an electron beam is utilized to expose the resist layer 10.

The complete system includes an electron beam column, as described in detail hereinafter, and a control subsystem (not shown) which controls each element of the electron beam column and the movement of the worktable 14 during exposure of a workpiece. Suitable control subsystems are known generally in the field of electron beam lithography. Typically included in the control subsystem are a computer for storage and processing of pattern data and for overall control, power and control circuits for the electron beam column, sensors and motors for controlling the movement of the worktable, a substrate handler, and a vacuum system. It will be understood that the electron beam column and the chamber in which the workpiece is mounted are maintained at high vacuum during processing.

The electron beam column illustrated in FIG. 1 includes an electron source 16 which emits an electron beam 18 along the axis of the electron beam column. The electron source 16 is described in more detail hereinafter. The electron beam 18 passes through centering coils 20, which precisely align the electron beam with the axis of the column, and illuminates a first aperture plate 22 having a first aperture 24 therethrough. The beam 18 is focused by a condenser lens 26 to provide an image of the source 16 between the plates of a shaping deflector 28. The beam 18 then passes through an imaging lens 30 which focuses an image of the first aperture 24 onto a second aperture plate 32 having a second aperture 34 therethrough. The shaping deflector 28 operates to deflect the image of the first aperture 24 relative to the second aperture 34 so as to provide a beam having a cross-section suitable for variable line scanning, as described in detail hereinafter. In addition, the beam 18 is blanked off by the shaping deflector 28. The electron beam 18 then passes through a demagnifying lens 36, a correcting deflector 38, deflection coils 40 and a projection lens 42. The demagnifying lens 36 and the projection lens 42 demagnify the beam 18 to its final size and project an image of the shaped beam onto the workpiece. The deflection coils 40 operate to deflect the shaped beam to any specified position within a prescribed scanfield on the workpiece. The correcting deflector 38 provides very high speed electrostatic deflection of the beam 18 over short distances.

Figure 2A:
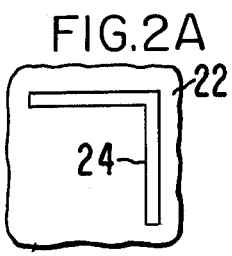
FIGS. 2a-2c illustrate alternative embodiments of the first shaping aperture in the system of FIG. 1.
Figure 2B:
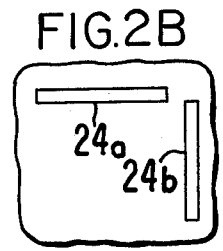
Figure 2C:
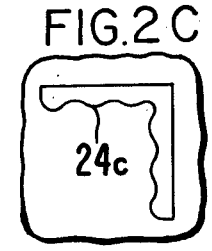

Referring now to FIG. 2a, there is shown a partial view of the first aperture plate 22 as viewed along the axis of the electron beam column. The first aperture plate 22 can have any convenient shape. The first aperture 24, in general, is in the form of two generally orthogonal elongated figures which may or may not intersect. The elongated figures are generally straight and have finite width. Each of the figures has at least one pair of adjacent orthogonal edges. The dimensions of the two orthogonal figures, in conjunction with the demagnification of the electron optical column, define the maximum cross-sectional dimensions of the beam 18 which is projected onto the workpiece. The electron beam 18, as it passes through the first aperture 24, is thus shaped so as to have a cross-section comprising two generally orthogonal elongated figures. The beam 18 is further shaped as it passes through the second aperture 34, as described hereinafter. The first aperture 24 illustrated in FIG. 2a includes two intersecting elongated rectangles and is generally L-shaped. In one preferred embodiment, each leg of the L-shaped aperture 24 is 200 micrometers long and 15 micrometers wide and the material of the first aperture plate 22 is rhodium plated copper. A second embodiment, in which the first aperture comprises two orthogonal slits 24a, 24b, which do not intersect, is illustrated in FIG. 2b. FIG. 2c depicts a generally L-shaped first aperture 24c in which one edge of each leg is straight and free of irregularities, or "good," whereas the opposite edge of each leg can be rough, irregular and generally lacking in precision. This configuration of first aperture is permissible since the final beam cross-section is defined by the two "good" edges of the aperture 24c in conjunction with the second aperture 34 as described hereinafter.

Figure 3:
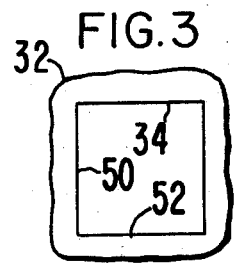
FIG. 3 illustrates one embodiment of the second shaping aperture in the system of FIG. 1.

The second aperture plate 32 as viewed along the axis of the electron beam column is shown in FIG. 3. While the second aperture 34 is illustrated as a square, this aperture can have any convenient shape which will provide two "good" adjacent orthogonal edges 50, 52 which are straight and free of irregularities.

Figure 4A:
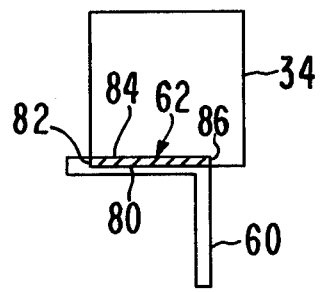
FIGS. 4a-4d illustrate the operation of the system of FIG. 1 in providing a line of variable length, width and orientation.
Figure 4B:
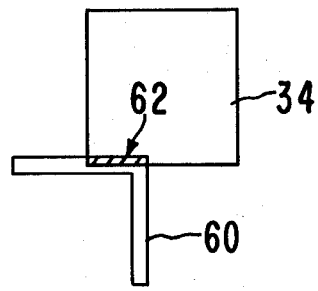
Figure 4C:
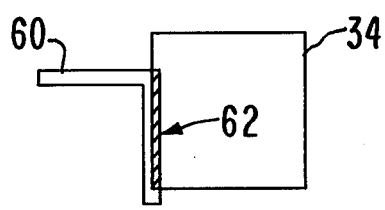
Figure 4D:
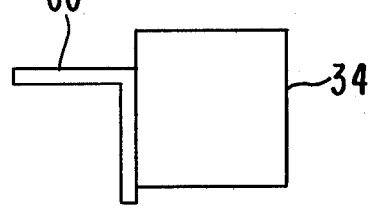

The operation of the first aperture 24, the second aperture 34 and the shaping deflector 28 to provide the desired beam shaping is illustrated in FIGS. 4a-4c. The operation of the same elements to provide beam blanking is illustrated in FIG. 4d. While only one set of electrostatic deflector plates is illustrated in FIG. 1, it will be understood that the shaping deflector 28 comprises a quadrupole or octopole deflector which permits deflection of the beam 18 in any direction relative to the axis by application of appropriate voltages thereto. Each of the FIGS. 4a-4d depicts the superposition of a first aperture image 60 and the second aperture 34. The relative positions of the first aperture image 60 and the second aperture 34 are determined by the voltages applied to the shaping deflector 28. The portion of the electron beam 18 which passes through the second aperture 34 is determined by the amount of overlap between the second aperture 34 and the first aperture image 60 and has a cross-section in the form of an intermediate line 62 of variable length and width and either a vertical or a horizontal orientation as indicated by the crosshatched areas in FIGS. 4a-4c. FIG. 4a illustrates the shaping of the beam 18 to provide a horizontal line 62 of nearly maximum length. In FIG. 4b, the shaping deflector 28 has moved the first aperture image 60 to the left thereby shortening the horizontal line 62. FIG. 4c illustrates the shaping of the beam 18 to provide a vertical line 62 of nearly maximum length.

Figure 5A:
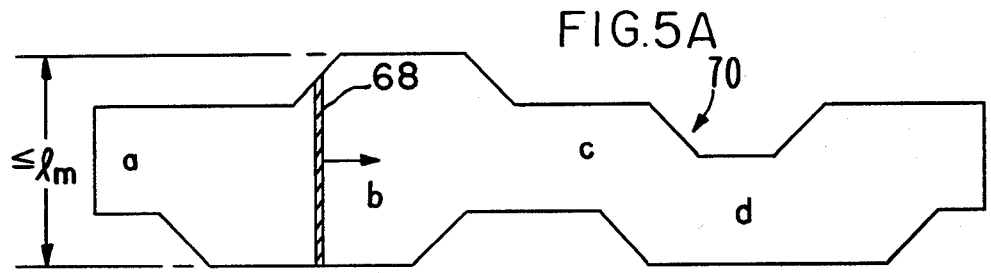
FIGS. 5a-5c illustrate the exposure of a pattern by the system of FIG. 1 and the required deflection voltages.

An image of the intermediate line 62 is projected by the demagnifying lens 36 and the projection lens 42 onto the surface of the workpiece to provide a projected line 68 at the workpiece, as shown in FIG. 5a, which has a vertical or a horizontal orientation and which is variable in length up to a maximum length $l_m$ determined by the dimensions of the apertures 24, 34. It will be obvious that the line beam can also be varied in width by approximate movement of the image 60 relative to the second aperture 34. A maximum width w is determined by the width of each figure comprising the first aperture 24. In one preferred embodiment, the maximum length $l_m$ of the projected line 68 at the workpiece is 3 micrometers and the maximum width w is 0.2 micrometers. FIG. 4d illustrates the blanking of the beam 18 when the first aperture image 60 and the second aperture 34 have no overlapping area.

Referring again to FIG. 1, the electron source 16 includes a cathode 64, an anode 66 and a Wehnelt electrode 67 which suppresses electron emission away from the tip of the cathode 64 and focuses the beam to a crossover of minimum diameter in the vicinity of the anode 66. For proper operation of the system, uniform electron beam illumination of the first aperture 24 is required in order to insure uniform exposure of the workpiece. A preferred electron source 16 utilizes a LaB$_6$ cathode with a flat tip.

Figure 5B:
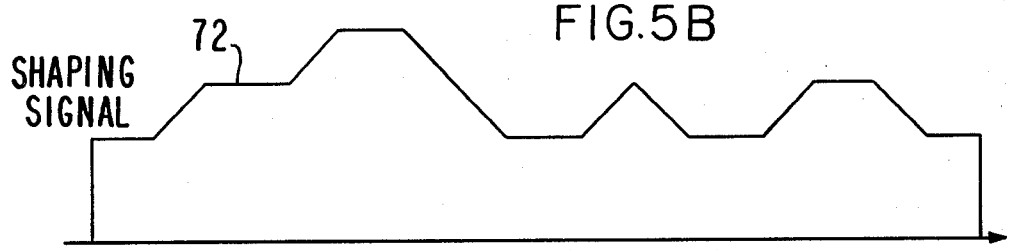
Figure 5C:
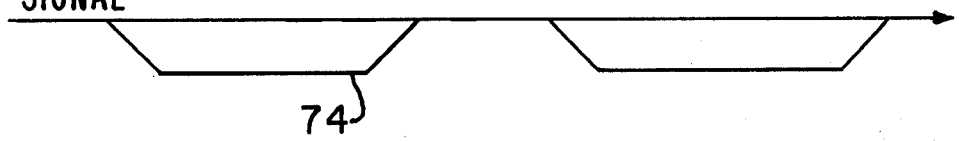

The exposure of an arbitrarily shaped pattern 70 by scanning of the variable length projected line 68 is illustrated in FIG. 5a. It is assumed that the pattern 70 is smaller in vertical dimension than the maximum length $l_m$ of the line 68 and that the pattern 70 does not cross a field boundary. The area which can be scanned without movement of the workpiece is defined by the field boundary. Initially, the beam 18 is shaped, as illustrated in FIG. 4c, and is positioned by the deflection coils 40 at the left edge of the pattern 70. The vertical projected line 68 is then scanned to the right at a constant speed by application of a steadily increasing current to the deflection coils 40. Simultaneously, the shaping signal 72, illustrated in FIG. 5b, is applied to the shaping deflector 28 and in the correcting signal 74, illustrated in FIG. 5c, is applied to the correcting deflector 38. The shaping signal 72 is operative to increase or decrease the length of the line 68 as required to expose the pattern 70. For example, the pattern 70 increases in width and the shaping signal 72 increases in amplitude from region a to region b, as shown in FIGS. 5a and 5b. The correcting signal 74 is operative to shift the entire line 68 up or down as required by the pattern 70. For example, the pattern 70 has the same width in regions c and d but is shifted downwardly from region c to region d by the correcting signal 74. When the line 68 reaches the right edge of the pattern 70, it is blanked off, as illustrated in FIG. 4d, and is shifted to the next pattern to be scanned. A vertically oriented pattern is similarly exposed by vertical motion of a horizontal projected line 68. Angled patterns are exposed by simultaneous application of appropriate currents to the x and y portions of the deflection coils 40.

As noted hereinabove, radial beam spreading due to mutual repulsion between electrons is one of the factors contributing to the loss of resolution in the projected line 68. The radial beam spread $\delta_r$ is given approximately by (See E. Goto et al. in Proc. 8th Int. Conf. on Electron and Ion Beam Science and Technology, p. 140 (1978).)

$$\delta_r = (KI_BL/V^{3/2}\alpha_F)$$

where $I_B$ is the beam current, V is the beam voltage, L is the length over which the interaction occurs from an initially defining condition, $\alpha_F$ is the beam semiangle from the projection lens to the workpiece and K is a constant. Thus, it is clear that beam spreading can be reduced by reducing the beam current $I_B$. However, in order to achieve high speed operation, it is necessary to maximize the current reaching the workpiece.

With reference to FIG. 4a, it is seen that the edges 80 and 82 of the intermediate line 62, which becomes the projected line 68, are defined by the second aperture 34 whereas the edges 84 and 86 are defined by the first aperture 24. Thus, the edges 80, 82 experience beam spreading over a distance $L_1$, as indicated in FIG. 1, and the edges 84, 86 experience beam spreading over a distance $L_1 + L_2$. The edges 84, 86 therefore exhibit greater beam spreading and will have poorer resolution at the workpiece than the edges 80, 82. Radial beam spreading occurring above the first aperture 24 is of no consequence since the initial shape of the beam 18 is defined by the first aperture 24.

The radial beam spreading in the electron beam column of the present invention can be compared with beam spreading in prior art columns in which the first shaping aperture is square. For a given V and $\alpha_F$, the above expression for $\delta_r$ can be rewritten as $$\delta_r = CI_BL$$

where C is a constant. When $K = 10^4$, $V = 20$ kilovolts and $\alpha_F = 8$ milliradians, then $C = 0.44$. For edges 84, 86, $$\delta_r = 0.44(L_1I_1 + L_2I_2)$$

where $I_1$ is the beam current between the second aperture 34 and the workpiece and $I_2$ is the beam current between the first aperture 24 and the second aperture 34.

In one illustrative example of the present invention, the first aperture 24 is L-shaped with each leg thereof having a length of 200 micrometers and a width of 15 micrometers. The beam current $I_2$ passing through the first aperture 24 is assumed to be 1.5 microamp. As can be seen in FIG. 4, the beam current $I_2$ is reduced by the second aperture 34. The maximum beam current $I_1$ is assumed to be 0.5 microamp. In the present example, $L_2$ is 0.2 meter and $L_1$ is 0.3 meter. Substituting these values into the expression for $\delta_r$ gives $\delta_r$(Invention)=0.2 micrometer Turning now to consideration of prior art electron beam columns for variable line scanning, a square first aperture was utilized. Assuming for purposes of comparison that the square first aperture is 200 micrometers on a side and that the same current $I_1$ to the workpiece is desired, it will be seen that the current $I_2$ is increased in proportion to the area of the first aperture. The prior art square aperture has about six times the area of the L-shaped aperture in the above illustrative example and passes about six times as much current $I_2$. Thus, $I_2$ in the prior art example is 9 microamps. Substituting these current values in the expression for $\delta_r$ gives $\delta_r$(Prior Art)=0.86 micrometer Thus, in the illustrative example, the present invention has reduced the value of $\delta_r$ to less than one fourth of its value according to the prior art.

Thus, there is provided by the present invention a charged particle beam exposure system wherein radial beam spreading is significantly reduced and the pattern line resolution is improved in comparison with prior art systems. This improvement in line resolution permits the application of higher beam currents to the workpiece without loss of resolution and therefore permits exposure of the workpiece at higher speeds than was previously possible.

While there has been shown and described what is at present considered the preferred embodiments of the invention, it will be obvious to those skilled in the art that various changes and modifications may be made therein without departing from the scope of the invention as defined by the appended claims.

What is claimed is:

1. A charged particle beam exposure system for selectively irradiating the surface of a workpiece to be patterned, said system being of the type wherein said beam has a cross-section at the surface of said workpiece comprising a projected line of variable length, of controlled width and one of two orthogonal orientations, said system comprising:
   means for generating a charged particle beam;
   aperture plate means, including aperture means positioned for illumination by said charged particle beam, operative to shape said charged particle beam so as to provide said beam with a cross-section comprising two generally orthogonal elongated figures, each of said elongated figures comprising at least one pair of adjacent orthogonal edges;
   a shaping aperture plate having a shaping aperture with two adjacent orthogonal edges;
   means interposed between said aperture plate means and said shaping aperture plate for focusing an image of said elongated figures onto said shaping aperture plate;
   means for deflecting said image of said elongated figures relative to the orthogonal edges of said shaping aperture so as to provide an intermediate line of desired length, width and orientation, said intermediate line being defined at any instant of time by the portion of said image of said elongated figures which is superimposed on said shaping aperture;
   means for projecting a demagnified image of said intermediate line onto said workpiece, thereby forming said projected line at the surface of said workpiece; and
   means for directing said projected line to any specified position on the surface of said workpiece,
   whereby said aperture plate means limits charged particle beam current and thereby provides reduced beam spreading and improved resolution of said projected line.

2. The charged particle beam exposure system as defined in claim 1 wherein said aperture means comprises two orthogonal slits.

3. The charged particle beam exposure system as defined in claim 1 wherein said aperture means comprises a pair of elongated openings in orthogonal relationship, said openings intersecting at one end thereof to form a single aperture.

4. The charged particle beam exposure system as defined in claim 3 wherein each of said elongated openings has the shape of an elongated rectangle.

5. The charged particle beam exposure system as defined in claim 4 wherein said shaping aperture is rectangular in shape.

6. The charged particle beam exposure system as defined in claim 5 wherein said means for deflecting said image includes electrostatic deflection means for high speed shaping of said intermediate line.

7. A charged particle beam exposure system for selectively irradiating the surface of a workpiece to be patterned, said system being of the type wherein said beam has a cross-section at the surface of said workpiece comprising a projected line of variable length, of controlled width and one of two orthogonal orientations, said system comprising:
   means for generating a charged particle beam;
   a first apertured plate having a generally L-shaped first aperture which is illuminated by said charged particle beam;
   a second apertured plate having a second aperture with two adjacent orthogonal edges;
   means interposed between said first and said second apertured plates for focusing an image of said first aperture onto said second apertured plate;
   means for deflecting said image of said first aperture relative to said second aperture so as to provide an intermediate line of variable length and width and one of two orthogonal orientations, said intermediate line being defined at any instant of time by the portion of said image of said first aperture which is superimposed on said second aperture and by the position of said image relative to said orthogonal edges;
   means for projecting a demagnified image of said intermediate line onto said workpiece, thereby forming said projected line at the surface of said workpiece; and means for directing said projected line to any specified position on the surface of said workpiece, whereby said first apertured plate limits charged particle beam current and thereby provides reduced beam spreading and improved resolution of said projected line.

8. The charged particle beam exposure system as defined in claim 7 wherein said generally L-shaped first aperture comprises a pair of legs intersecting at right angles, each of said legs being in the form of an elongated rectangle.

9. The charged particle beam exposure system as defined in claim 8 wherein said second aperture is rectangular in shape and wherein said intermediate line is formed by positioning the image of one of said legs of said first aperture on one of said orthogonal edges of said second aperture and parallel thereto.

10. The charged particle beam exposure system as defined in claim 9 wherein said means for deflecting said image of said first aperture includes electrostatic deflection means for high speed shaping of said intermediate line and said means for directing said projected line includes electrostatic deflection means for high speed positioning of said projected line on the surface of said workpiece.

* * * * *